US012626027B2

(12) United States Patent
De Weer

(10) Patent No.: US 12,626,027 B2
(45) Date of Patent: May 12, 2026

(54) METHODS FOR MODELLING VARIATIONS OF REPEATING PARTS OF A COMPONENT

(71) Applicant: Siemens Industry Software NV, Leuven (BE)

(72) Inventor: Tom De Weer, Leuven (BE)

(73) Assignee: Siemens Industry Software NV, Leuven (BE)

( * ) Notice: Subject to any disclaimer, the term of this patent is extended or adjusted under 35 U.S.C. 154(b) by 1100 days.

(21) Appl. No.: 17/679,347

(22) Filed: Feb. 24, 2022

(65) Prior Publication Data

US 2023/0110927 A1 Apr. 13, 2023

(30) Foreign Application Priority Data

Mar. 5, 2021 (EP) ..................................... 21160989

(51) Int. Cl.
  *G06F 30/10* (2020.01)
  *G06F 30/23* (2020.01)
(52) U.S. Cl.
  CPC .............. *G06F 30/10* (2020.01); *G06F 30/23* (2020.01)
(58) Field of Classification Search
  None
  See application file for complete search history.

(56) References Cited

U.S. PATENT DOCUMENTS

| | | | | |
|---|---|---|---|---|
| 10,635,088 | B1 * | 4/2020 | Bandara | .............. G05B 19/182 |
| 2010/0153077 | A1 | 6/2010 | Suresh et al. | |

| | | | | |
|---|---|---|---|---|
| 2018/0114110 | A1 * | 4/2018 | Han | ........................ G06N 3/082 |
| 2019/0005158 | A1 * | 1/2019 | Nakhjavani | ............ G06Q 10/06 |
| 2019/0138670 | A1 | 5/2019 | Bandara et al. | |
| 2019/0197773 | A1 | 6/2019 | Schmidt et al. | |
| 2019/0303524 | A1 * | 10/2019 | Fenzi | .................... G06F 30/392 |

(Continued)

FOREIGN PATENT DOCUMENTS

| | | | | |
|---|---|---|---|---|
| CN | 108647405 | A | 10/2018 | |
| CN | 108920796 | A * | 11/2018 | ............. G06F 30/23 |

(Continued)

OTHER PUBLICATIONS

Z. Wu et al., "Substructure-Based Topology Optimization for Symmetric Hierarchical Lattice Structures"; Symmetry; vol. 12; No. 4; Issue 678; pp. 1-11 (Apr. 24, 2020).

(Continued)

*Primary Examiner* — Rehana Perveen
(74) *Attorney, Agent, or Firm* — Lempia Summerfield Katz LLC

(57) ABSTRACT

A computer-implemented method for modelling variations of repeating parts of a component is disclosed herein. The method includes providing parameter sets for part configurations of a plurality of different of parts, wherein the parameters of each parameter set respectively define the part configuration of a part; selecting a selection of the part configurations; providing a part model for each part configuration of the selection, wherein the part model relates forces and displacements to locations of the respective part; and building an approximator, wherein the approximator is provided for interpolating the part models to approximate a part model of a part configuration that does not belong to the selection of the part configurations.

15 Claims, 3 Drawing Sheets

(56) References Cited

U.S. PATENT DOCUMENTS

2021/0173971 A1* 6/2021 Choi ..................... G06F 30/20

FOREIGN PATENT DOCUMENTS

| CN | 109313670 A | 2/2019 |
|----|-------------|--------|
| CN | 110008495 A | 7/2019 |

OTHER PUBLICATIONS

J. Speet, "Parametric reduced order modeling of structural models by manifold interpolation techniques"; XP055827633; URL:http://resolver.tudelft.nl/uuid:d1b77685-5b95-4991-bd41-7ce4cdd01605, pp. 1-114 (Nov. 10, 2017).

R. Romeo et al., "Model Reduction of Self-Repeating Structures with Applications to Metamaterial Modeling," Proceedings of the 37th IMAC; A Conference and Exposition on Structural Dynamics 2019; IN "Structural Dynamics and Renewable Energy"; vol. 1; pp. 49-62; (Jan. 1, 2019).

G. Dong et al., "A Survey of Modeling of Lattice Structures Fabricated by Additive Manufacturing," Journal of Mechanical Design, vol. 139, p. 1-13 (Oct. 2017).

M. Helou et al., "Design, analysis and manufacturing of lattice structures: an overview," International Journal of Computer Integrated Manufacturing, vol. 31, No. 3, pp. 243-261 (2018).

* cited by examiner

A)
VRP
PRM CFG
PRM CFG
PRM CFG

B)
VRP => SCT

C)
VRP, PRM, CFG =>
MDL (FRC, DPL, LCT)

a.
VRP => MSH, SOE b.
PJM, SMX c.
CTS, EDF, CDF d.
VRP, PPM, RDF, ORD
=> RSM

D)
APX, PSE
=> RSM

E)
APX, PSE, VRP
=> RCP

METHODS FOR MODELLING VARIATIONS OF REPEATING PARTS OF A COMPONENT

The present patent document claims the benefit of European Patent Application No. 21160989.6, filed Mar. 5, 2021, which is hereby incorporated by reference in its entirety.

TECHNICAL FIELD

The disclosure relates to a computer-implemented method for modelling variations of repeating parts of a component.

BACKGROUND

Modelling variations of repeating parts of a component may need to be done in performance of engineering tasks. For example, lattice structures, (e.g., of the lightweight type), become more popular in particular due to new production techniques like additive manufacturing, which enables easier creation of, e.g., lightweight structures with variations of repeating parts of the component to be generated.

Lattice structures according to a narrower definition are containing beams that are connected at joints, e.g., by repeating a unit cell.

This disclosure may be applicable to lattice structures which include porous three-dimensional spatial structures formed and tessellated by unit cells with different topological geometries. This kind of lattice structure may be considered to belong to cellular structures (e.g., including foam structures, honeycomb structures, and lattice structures).

If, for example, as a component a lattice structure with joints is considered, these joints may be provided as variations of repeating parts, and they may have a complex geometry. Such joints may conventionally be hard to simulate accurately without a large computational effort. Models required for industrially relevant applications may be highly detailed and may quickly become unfeasible regarding availability of computation power.

Lattice structures may be simulated with the Finite Element Method (FEM). Here, the structure is subdivided ("meshed") into a mesh of simpler geometries called Finite Elements. These elements are more easily discretized and after assembly the full geometry is captured. During the post processing, the performance of the design may be gauged by looking at the simulation results. The total stiffness and mass may be used in topology optimization frameworks, wherein stress concentrations decide the fatigue life of the structure and an eigenvalue analysis shows the dynamical behavior of the structure.

There are two types of mesh that may be used for lattices.

The first type of mesh is a solid mesh, wherein the lattice structure is subdivided into a large number of three-dimensional (3D) elements (e.g., Simcenter Nastran's CTETRA). Due to the geometrical complexity of lattices, a lot of these elements may be needed. This method may therefore be considered 'accurate but slow'.

The second mesh type is the one-dimensional (1D) mesh, wherein every beam in the mesh is replaced by a beam element (for example, Simcenter Nastran's CBAR). Fewer elements are thus needed, resulting in a much smaller computation time. A problem with this approach is that these beam elements are based on beam theory (e.g., Euler-Bernoulli beam theory, Timoshenko-Ehrenfest beam theory), which becomes inaccurate as the beams become thicker.

Aspects of lattice modelling are known from: M. Helou and S. Kara, "Design, analysis and manufacturing of lattice structures: An overview," International Journal of Computer Integrated Manufacturing, 31 (3):243-261, 2018.

Another publication is G. Dong, Y. Tang, and Y. F. Zhao, "A survey of modeling of lattice structures fabricated by additive manufacturing," Journal of Mechanical Design, Transactions of the ASME, 139(10), 2017.

Some teachings of these publications may be summarized regarding the field of the disclosure as follows. A major problem is that by replacing the beams with one-dimensional elements, every joint is replaced by a single point. However, these nodes contain a lot of stiffness and mass. In bending-dominated lattices, they also have a large influence on the fatigue life because that is where the highest stress occurs. There are some techniques in literature that try to mitigate this problem by increasing the beam thickness close to the joints, but this is more a pragmatic but less accurate solution. Further, there is no generally accepted way to determine by how much the thickness then needs to change. This method may therefore be considered "fast but inaccurate".

Currently, there exist methods for modelling variations of repeating parts of a component in particular for modelling a joint of a lattice structure. Such methods may benefit from improvements. It is one objective of the disclosure to improve the design process of components with variations of repeating parts.

SUMMARY AND DESCRIPTION

Based on the prior art described above and the problems associated, the disclosure is based on the task of improving the design process of a component including variations of repeating parts, like lattice structures.

The scope of the present disclosure is defined solely by the appended claims and is not affected to any degree by the statements within this summary. The present embodiments may obviate one or more of the drawbacks or limitations in the related art.

In accordance with the disclosure, there is provided a solution for the above-described problems by the incipiently defined method. The method includes providing parameter sets for part configurations of a plurality of different of parts, wherein the parameters of each parameter set respectively define the part configuration of a part; selecting a selection of the part configurations; providing a part model for each part configuration of the selection, wherein the part model relates forces and displacements to locations of the respective part; and building an approximator, wherein the approximator is provided for interpolating the part models to approximate a part model of a part configuration that doesn't belong to the selection of the part configurations.

Components may include lattice structures, porous three-dimensional spatial structures formed and tessellated by unit cells with different topological geometries, cellular structures like foam structures, honeycomb structures, and the like.

Herein, variations of repeating parts mean structures including elements with similar function and similar geometry which may partly be identical and partly be different and which may be defined by a parameter set defining the respective part configuration. The method uses these variations of repeating part as a new type of element which may be called a "Parameterized Superelement" which may be used more broadly for any structure containing a large amount of parts with a similar (but slightly varying) geometry.

Forces may include linear forces like tensile force, compression force, shear force, and the rotational equivalent of linear force normally termed as moment, moment of force, rotational force or turning effect, torsional force. Forces may further include pressure, area forces, tensile stress, shear stress and compressive stress.

Concurrently, for lattice design, it is highly attractive to use a topology optimization framework that decides to put the right lattice at the right place. However, optimization is an order of magnitude more complex and therefore expensive than simulation. Optimization of the highly detailed models required for industrially relevant applications therefore quickly becomes unfeasible.

This disclosure unlocks the possibility of fast and accurate simulation of, e.g., lattices and may be even their subsequent optimization. This is done by the method acts by adopting a reduction and interpolation technique that simulates the, e.g., lattice joints using so-called parametrized parts, respectively the "Parametrized SuperElements (PSE)." Furthermore, the disclosure may be applied to structures that contain a large amount of slightly varying structures.

Currently available Finite Element Methods may be extended by the method. Some examples of components respectively the structures may be applied to, (but not limited to): truss bridges and tower cranes (because they may be viewed as macroscale lattices); gas turbine rotors (because their blades all differ to prevent resonance); and ship hulls due to their large amount of plates, rivets, welds, and beams in varying configurations.

According to an embodiment, the providing of a part model for each part configuration of the selection, wherein the part model relates forces and displacements to locations of the respective part, includes for each part configuration of the selection the acts: meshing a mesh of the part with solid elements; generating a preliminary part model of the meshed part by relating forces and displacements to locations defining the solid elements through a first part stiffness matrix; identifying constraints reducing the number of exterior degrees of freedom of movement by constrained degrees of freedom; and generating the part model by reducing the model order of the preliminary part model to the remaining exterior degrees of freedom by eliminating the constrained degrees of freedom of the first part stiffness matrix resulting in a reduced stiff-ness matrix. Further, the building the approximator is performed by interpolating the reduced stiffness matrixes to extract the reduced stiffness matrix of a part that doesn't belong to the selection of the part configurations.

According to another embodiment, the repeating parts may be joints of a lattice structure.

According to another embodiment, the selecting may be done by selecting all types of variations or by selecting only a subset of the whole variation plurality. In case of subset selection, the selection may be done randomly or by a systematic approach. The systematic approach may be done by varying parameters of the parameter set systematically. This variation may be done stepwise, maybe in equidistant steps along the range of the respective parameter if the range is limited with an upper and lower limit. Instead of equidistant steps logarithmic step widths or other step withs may be used, in particular if one parameter is not limited. The number of variations may be limited to a predefined number per parameter and the steps width may be defined by parameter range divided by number of steps. The resulting variation number may be the product of all number of respective parameter variants.

According to still another embodiment, the act of reducing the model order is done using a Guyan reduction resulting in a reduced stiffness matrix. In computational mechanics, Guyan reduction, also known as static condensation, is a dimensionality reduction method which reduces the number of degrees of freedom by ignoring the inertial terms of the equilibrium equations and expressing the unloaded degrees of freedom in terms of the loaded degrees of freedom (see, e.g., GUYAN, J., "Reduction of stiffness and mass matrices," AIAA Journal 3, 380-380 (1965)).

According to another embodiment, the interpolating of the building of the approximator uses Canonical Polyadic Decomposition. This tensor rank decomposition is one generalization of the matrix singular value decomposition applied to tensors (see, e.g., F. L. Hitchcock, "The expression of a tensor or a polyadic as a sum of products," Journal of Mathematics and Physics. 6:164-189 (1927)).

The disclosure also relates to a computer-implemented method for optimization of a component including repeatedly carrying out an optimization act by the computer-implemented method for modelling variations of repeating parts of a component according to the preceding description and/or the features as defined by the claims for several variations of the component and subsequently comparing the results of the modelling with regard to predefined performance factors to identify starting configuration for the next optimization act. This optimization may be carried out as long as predefined target performance factors are reached. The optimization may also follow parallel tracks with different starting variations of the component and may interchange the variation features according to a predefined optimization strategy.

The disclosure also relates to an additive manufacturing method for generating a component with variations of repeating parts, wherein a design act includes a method according to the above defined disclosure respectively to one of its embodiments, wherein a subsequent generating act is done according to a design generated by the design act.

BRIEF DESCRIPTION OF THE DRAWINGS

Embodiments of the disclosure are described, by way of example only, with reference to the accompanying drawings, of which.

The illustration in the drawings is in schematic form. It is noted that in different figures, similar or identical elements may be provided with the same reference signs.

DETAILED DESCRIPTION

Figure 1:
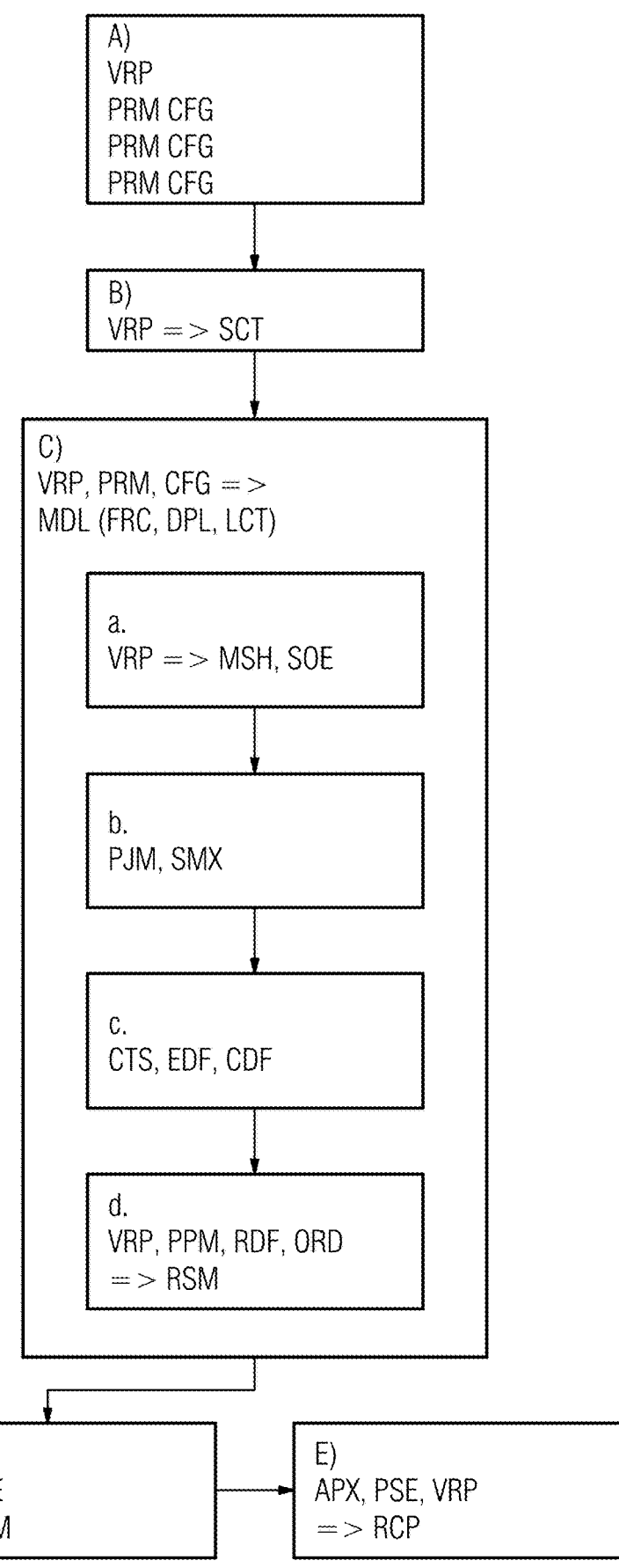
FIG. 1 depicts a flow diagram of a method according to an embodiment.

FIG. 1 depicts schematically a computer-implemented method for modelling variations of repeating parts VRP of a component CMP. The method may include providing parameter sets PRM for part VRP configurations CFG of a plurality of different parts VRP, wherein the parameters PRM of each parameter set PRM respectively define the part VRP configuration CFG of a part VRP.

The method may further include selecting a selection SCT of the part VRP configurations CFG.

The method may further include providing a part VRP model MDL for each part VRP configuration CFG of the selection SCT, wherein the part VRP model MDL relates forces FRC and displacements DPL to locations LCT of the respective part VRP; meshing a mesh MSH of the part VRP with solid elements SOE; generating a preliminary part VRP model PPM of the meshed part VRP by relating forces FRC and displacements DPL to locations LCT defining the solid elements SOE through a first part VRP stiffness matrix SMX; identifying constraints CTS reducing the number of exterior degrees of freedom EDF of movement by constrained degrees of freedom CDF; and generating the part VRP model MDL by reducing the model order ORD of the preliminary part VRP model PPM to the remaining exterior degrees of freedom RDF by eliminating the constrained degrees of freedom CDF of the first part VRP stiffness matrix SMX resulting in a reduced stiffness matrix RSM.

The method may further include building the approximator APX by interpolating the reduced stiffness matrixes RSM to extract the reduced stiffness matrix of a part VRP that doesn't belong to the selection SCT of the part VRP configurations CFG.

The method may further include generating a reduced component model RCP by using the approximator APX for several parts VRP of the component CMP and combining the resulting reduced stiffness matrices of these parts VRP with other models of elements of the component CMP.

The approximator APX may be considered a Parametrized Superelement PSE.

Figure 2:
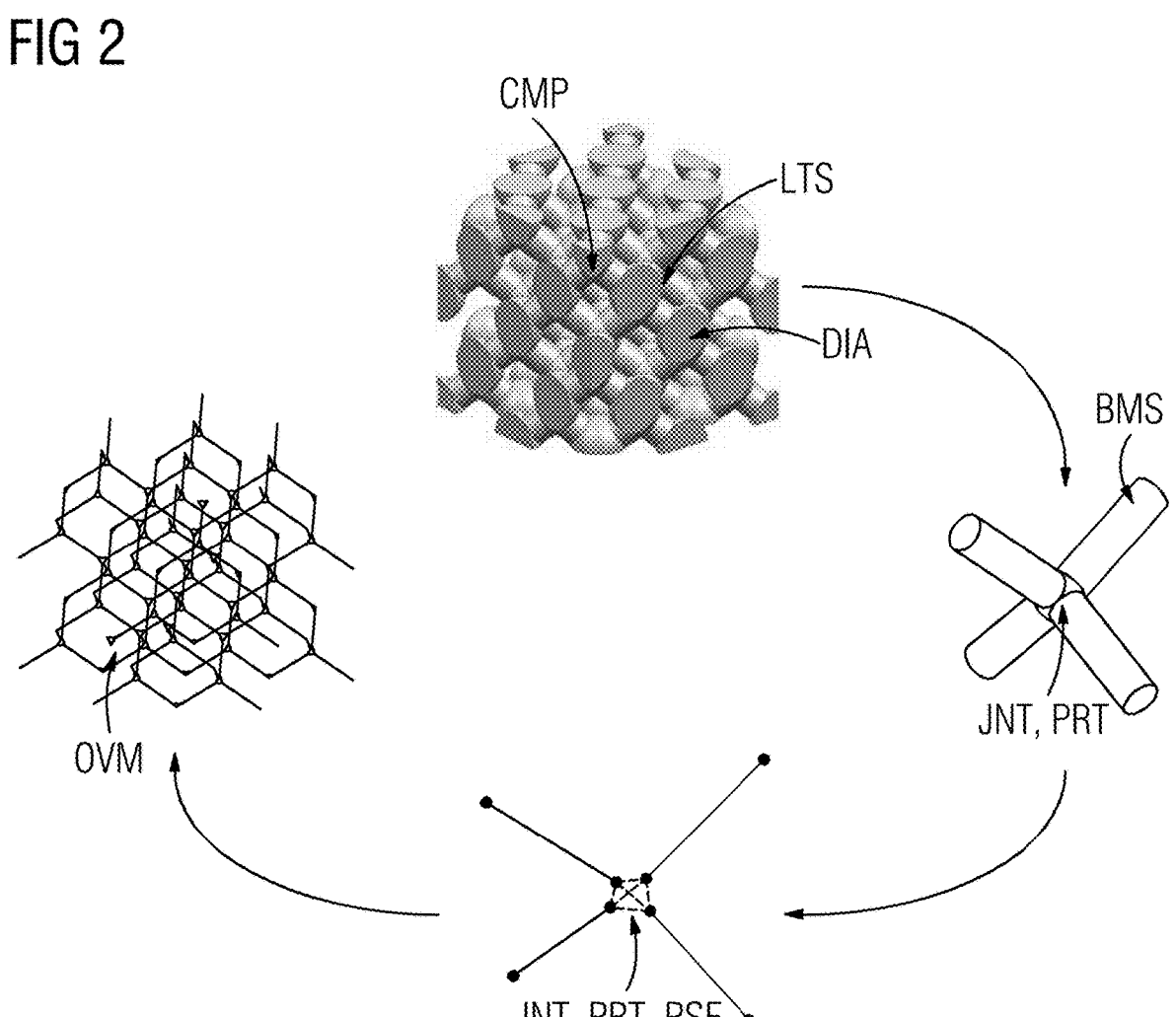
FIG. 2 depicts a flow diagram of a method according to an embodiment for modelling a component.

FIG. 2 depicts a simplified illustration showing certain acts of the method for modelling a component CMP, herein a lattice structure LTS. The usage of the approximator APX respectively the Parametrized Superelement PSE during lattice simulation, enables the efficient and accurate simulation of, e.g., the diamond lattice DIA shown. The illustration shows the diamond lattice DIA structure being simplified to beams BMS and joints JNT (shown exemplary for one joint JNT). The joint JNT, being a specimen of the general part PRT, is modelled as a Parametrized Superelement PSE and after doing so for all joints JNT the initial diamond lattice DIA structure is modelled. Finally, a reduced overall model OVM is obtained for the component CMP by combining all Parametrized Superelements PSE of the component CMP together with other element of the component. For the application of lattice structure simulation, the method may be part of a procedure which may simulate the beams BMS with 1D elements, but which models the joints JNT as Parametrized Superelements PSE.

The disclosure is suitable to lattice structural design due to the large number of joints JNT with a complex geometry. The disclosure may also be applied to truss bridges (because such a bridge contains a large number of beams and joints JNT) as well as any structure that contains many parts with a complex geometry (e.g., cars, planes, etc.) which are similar but include variations being defined by the parameter sets PRM for part VRP configurations CFG. Acts of the procedure illustrated include the joint JNT is modelled by meshing it with solid elements constraints CTS are added to reduce the number of exterior degrees of freedom (EDF).

According to an embodiment, connection faces of joints JNT of a lattice structure may be assumed to remain straight, which may result in a reduced number of remaining exterior degrees of freedom RDF, e.g., in six degrees of freedom per face. A subsequent reduction act may reduce the model order ORD to the exterior degrees of freedom EDF. This may be done by using a Guyan reduction (also known as substructuring, static condensation, etc.) which results in a reduced stiffness matrix similar to what would be achieved by an analytical element but applicable to more difficult geometries. Due to the computationally expensive reduction, a fast approximator APX on basis of a selection SCT of the part VRP configurations CFG may be built to extract the reduced stiffness matrix of a part VRP that doesn't belong to the selection. For a large number of joint configurations, the reduced matrices are generated. Then, they are interpolated in order to be able to extract the reduced stiffness matrix of a joint with parameters that are not previously simulated. In this case, the Canonical Polyadic Decomposition may be used because it eliminates all parameter dimensions, allowing for a one-dimension (1D) to 1D interpolation (e.g., illustrated in: https://www.tensorlab.net/doc/cpd.html).

A combination of the above acts enables an efficient calculation of the reduced stiffness matrix RSM that depends on the parameters of the complex geometry it represents.

Figure 3:
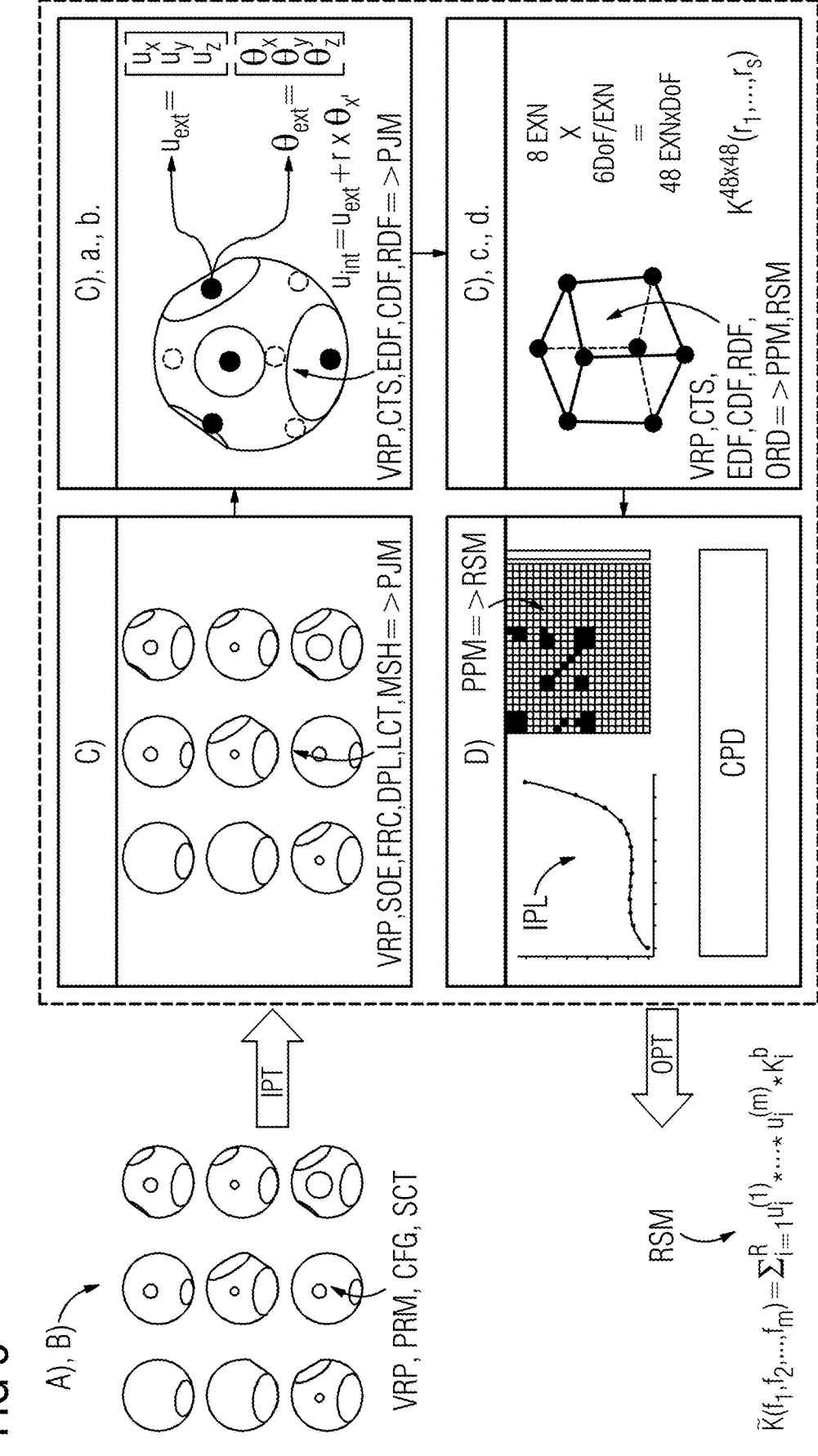
FIG. 3 depicts a flow diagram of a method according to an embodiment for generating an approximator.

FIG. 3 depicts acts of a method. In the method, parameter sets PRM are provided for part VRP configurations CFG a selection SCT of the part VRP configurations CFG is selected as an input IPT for the next act. The method may further include providing a part VRP model MDL for each part VRP configuration CFG by meshing with solid elements SOE, generating a preliminary part VRP model PJM of the meshed part VRP by relating forces FRC and displacements DPL to locations LCT defining the solid elements SOE through a first part VRP stiffness matrix SMX, meshing a mesh MSH of the part VRP with solid elements SOE), and generating a preliminary part VRP model PJM of the meshed part VRP as a first part VRP stiffness matrix SMX)).

The method may further include constraining with, e.g., the straight face assumption and reducing the remaining exterior degrees of freedom RDF. Higher order face constraints may also be used to make a Parametrized Superelement PSE. For example, 8 external nodes EXN and 6 degrees of freedom (DoF) respectively remaining degrees of freedom (RDF) result in a 48×48 stiffness matrix for the Parametrized Superelement PSE.

The method may further include building a fast approximator APX by repetition of the previous acts and interpolating IPL the reduced stiffness matrixes RSM to extract the reduced stiffness matrix of at least one part VRP that does not belong to the selection SCT of the part VRP configurations CFG. One technique used may be static condensation also known as the superelement approach or substructuring. Afterwards, an interpolation act is required to construct the approximator APX of the reduced stiffness matrix RSM provided as an output OPT of the method. One implementation uses the Canonical Polyadic Decomposition CPD.

In accordance with various embodiments of the present disclosure, the methods described herein may be implemented by software programs executable by a computer system. Further, in an exemplary, non-limited embodiment, implementations may include distributed processing, component/object distributed processing, and parallel processing. Alternatively, virtual computer system processing may be constructed to implement one or more of the methods or functionality as described herein.

Although the present specification describes components and functions that may be implemented in particular embodiments with reference to particular standards and protocols, the claim scope is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having similar functions.

Accordingly, replacement standards and protocols having the same or similar functions as those disclosed herein are considered equivalents thereof.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

As used in this application, the term "circuitry" or "circuit" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory (ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. A processor may receive instructions and data from a read only memory or a random-access memory or both. Certain elements of a computer include a processor for performing instructions and one or more memory devices for storing instructions and data. A computer may also include or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., E PROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, embodiments of the subject matter described in this specification may be implemented on a device having a display, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the subject matter described in this specification may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the subject matter described in this specification, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server may be remote from each other and may interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It should be noted that the use of "a" or "an" throughout this application does not exclude a plurality, and "comprising" does not exclude other acts or elements. Also, elements described in association with different embodiments may be combined. It should also be noted that reference signs in the claims should not be construed as limiting the scope of the claims.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for improving an efficiency and an accuracy of a physical simulation of three-dimensional (3D) components with repeating parts by modelling variations of repeating parts of a 3D component, the method comprising:

providing, by a processor, parameter sets for part configurations of a plurality of different parts, wherein parameters of each parameter set define a respective part configuration of a part of the plurality of different parts of the 3D component;

selecting, by the processor, a selection of the part configurations from a defined parameter space of configurations;

providing, by the processor, a part model for each part configuration of the selection, wherein the part model relates forces and displacements to locations of the respective part;

building, by the processor, a computational approximator, wherein the computational approximator is provided for interpolating the part models to approximate a part model of a part configuration that does not belong to the selection of the part configurations within the defined parameter space;

generating a reduced component model, using the computational approximator, for several parts of the 3D component, therein providing an improved efficiency and accuracy when a physical simulation of a 3D component is performed without the computational approximator; and manufacturing the 3D component using the reduced component model.

2. The method of claim 1, wherein the providing of the part model comprises:

meshing a mesh of the part with solid elements;

generating a preliminary part model of the meshed part by relating forces and displacements to locations defining the solid elements through a first part stiffness matrix;

identifying constraints reducing a number of exterior degrees of freedom of movement by constrained degrees of freedom; and generating the part model by reducing the model order of the preliminary part model to the remaining exterior degrees of freedom by eliminating the constrained degrees of freedom of the first part stiffness matrix resulting in a reduced stiffness matrix, and wherein the building of the approximator comprises interpolating the reduced stiffness matrixes to extract the reduced stiffness matrix of a part that does not belong to the selection of the part configurations.

3. The method of claim 2, wherein the repeating parts are joints of a lattice structure.

4. The method of claim 3, wherein the selecting of the selection of the part configurations is a random selection.

5. The method of claim 3, wherein the reducing the model order is done using a Guyan reduction resulting in the reduced stiffness matrix.

6. The method of claim 3, wherein the interpolating of the reduced stiffness matrices of the part models uses Canonical Polyadic Decomposition.

7. The method of claim 3, further comprising:

combining resulting reduced stiffness matrices of the several parts of the 3D component with other models of elements of the 3D component.

8. The method of claim 1, wherein the repeating parts are joints of a lattice structure.

9. The method of claim 1, wherein the selecting of the selection of the part configurations is a random selection.

10. The method of claim 2, wherein the reducing the model order is done using a Guyan reduction resulting in a reduced stiffness matrix.

11. The method of claim 1, wherein the interpolating of the reduced stiffness matrices of the part models uses Canonical Polyadic Decomposition.

12. The method of claim 1, further comprising:

combining resulting reduced stiffness matrices of the several parts of the 3D component with other models of elements of the 3D component.

13. An additive manufacturing method for generating a three-dimensional (3D) component with variations of repeating parts, the method comprising:

providing, by a processor, parameter sets for part configurations of a plurality of different parts, wherein parameters of each parameter set define a respective part configuration of a part of the plurality of different parts of the 3D component;

selecting, by a processor, a selection of the part configurations from a defined parameter space of configurations;

providing, by a processor, a part model for each part configuration of the selection, wherein the part model relates forces and displacements to locations of the respective part;

building, by the processor, a computational approximator, wherein the computational approximator is provided for interpolating the part models to approximate a part model of a part configuration that does not belong to the selection of the part configurations within the defined parameter space;

generating a reduced component model, using the computational approximator, for several parts of the 3D component, therein providing an improved efficiency and accuracy when a physical simulation of a 3D component is performed without the computational approximator; and generating the 3D component using the reduced component model.

14. A computer system for improving an efficiency and an accuracy of a physical simulation of a three-dimensional (3D) component with repeating parts by modeling variations of repeating parts of the 3D component, the computer system comprising:

a processor; and a memory, wherein the memory and the processor are configured to:

provide parameter sets for part configurations of a plurality of different parts, wherein parameters of each parameter set define a respective part configuration of a part of the plurality of different parts of the 3D component;

select a selection of the part configurations from a defined parameter space of configurations;

provide a part model for each part configuration of the selection, wherein the part model relates forces and displacements to locations of the respective part;

build a computational approximator, wherein the computational approximator is provided for interpolating the part models to approximate a part model of a part configuration that does not belong to the selection of the part configurations within the defined parameter space;

generate a reduced component model, using the computational approximator, for several parts of the 3D component, therein providing an improved efficiency and accuracy when a physical simulation of a 3D component is performed without the computational approximator; and generate the 3D component using the reduced component model.

15. The method of claim 1, further comprising:

outputting, by the processor, the computational approximator for use in the manufacturing of the 3D component.

\* \* \* \* \*